US009281812B2

(12) United States Patent
Kim

(10) Patent No.: US 9,281,812 B2
(45) Date of Patent: Mar. 8, 2016

(54) MIT TRANSISTOR SYSTEM INCLUDING CRITICAL CURRENT SUPPLY DEVICE

(71) Applicant: Electronics and Telecommunications Research Institute, Daejeon (KR)

(72) Inventor: Hyun-Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/322,223

(22) Filed: Jul. 2, 2014

(65) Prior Publication Data

US 2015/0008974 A1   Jan. 8, 2015

(30) Foreign Application Priority Data

Jul. 5, 2013  (KR) .......................... 10-2013-0078913
Dec. 16, 2013  (KR) .......................... 10-2013-0156332

(51) Int. Cl.
*H03K 17/687*   (2006.01)
*H03K 17/30*   (2006.01)
*H03K 17/567*   (2006.01)
*H03K 17/60*   (2006.01)

(52) U.S. Cl.
CPC .............. *H03K 17/30* (2013.01); *H03K 17/567* (2013.01); *H03K 17/60* (2013.01); *H03K 17/601* (2013.01); *H03K 2217/0009* (2013.01)

(58) Field of Classification Search
CPC ................... H01L 2924/0002; H01L 2924/00; H03K 17/04126; H02M 1/32
See application file for complete search history.

(56) References Cited

U.S. PATENT DOCUMENTS

| 5,130,620 | A  | * | 7/1992 | Inaji et al. ................ 318/400.35 |
| 2011/0018607 | A1 | * | 1/2011 | Kim et al. ...................... 327/478 |
| 2012/0138885 | A1 | * | 6/2012 | Wu et al. ........................... 257/5 |
| 2013/0278327 | A1 |   | 10/2013 | Kim et al. |

FOREIGN PATENT DOCUMENTS

| JP | 58-000526 U | 1/1983 |
| JP | 01-254019 A | 10/1989 |
| JP | 2011-503836 A | 1/2011 |
| KR | 10-2013-0047558 A | 5/2013 |
| WO | WO 2009-027826 A2 | 3/2009 |
| WO | WO 2012-096534 A2 | 7/2012 |

* cited by examiner

*Primary Examiner* — Sibin Chen
(74) *Attorney, Agent, or Firm* — Rabin & Berdo, P.C.

(57) ABSTRACT

Provided is a metal-insulator transition (MIT) transistor system including an MIT critical current supply device allowing MIT to occur between a control terminal and an outlet terminal of an MIT transistor for easily and conveniently driving the MIT transistor. A current supplier according to the present invention provides a critical current for allowing an MIT phenomenon to occur between the control terminal and the output terminal of the MIT transistor.

15 Claims, 17 Drawing Sheets

I: Inlet
O: Outlet
C: Control

2 Terminal effect

Pulse input 500KHz $V_{Control\ input}$ = 2V, $V_{CC,input}$ = 0V, Load1=0, Load2=1Ω

MIT TRANSISTOR SYSTEM INCLUDING CRITICAL CURRENT SUPPLY DEVICE

CROSS-REFERENCE TO RELATED APPLICATIONS

This U.S. non-provisional patent application claims priority under 35 U.S.C. §119 of Korean Patent Application Nos. 10-2013-0078913, filed on Jul. 5, 2013, and 10-2013-0156332, filed on Dec. 16, 2013, the entire contents of which are hereby incorporated by reference.

BACKGROUND OF THE INVENTION

The present invention disclosed herein relates to a transistor system, and more particularly, to driving of a metal-insulator transition (MIT) transistor.

Typically, one of the representative electronic devices is a transistor having three terminals. This transistor operates on the basis of semiconductor characteristics.

Semiconductor power devices are required to have good characteristics of allowing large currents to flow. However, heat may be greatly generated despite of flowing of not large current. When a size of a transistor becomes small to a nano size level, a short channel effect appears and makes it hard to operate as a transistor. Therefore, a device exceeding limitations of this electronic device has been increasingly requested and many researchers concentrate all their efforts on researches on a device exceeding the limitations.

One of principles of overcoming the limitations is an MIT principle. An MIT transistor, which does not use a field effect but use a hole-driven MIT phenomenon, is disclosed in Korean patent application publication No. 2012-0073002 and an article, "Applied Physics Letters 103, 1735-1(2013); http//scitation.aip.org/content/aip/journal/apl/103/17/10.1063/1.4826223". However, it is necessary to supply a critical current to allow the MIT phenomenon to occur.

Accordingly, a technology for simply supplying the critical current is necessary.

SUMMARY OF THE INVENTION

The present invention provides a current supplier supplying a critical current necessary for allowing an MIT phenomenon to occur in an MIT transistor in order to simply and conveniently drive the MIT transistor.

The present invention also provides an MIT transistor system capable of smoothly driving an MIT transistor.

Embodiments of the present invention provide metal-insulator transition (MIT) transistor systems, including: an MIT transistor; and a current supplier supplying a critical current for allowing an MIT phenomenon to occur between a control terminal and an output terminal of the MIT transistor.

In some embodiments, the current supplier may include a transistor receiving a pulse input signal and generating the critical current.

In other embodiments, the transistor may include an NPN bipolar transistor having a base to which the pulse input signal is received, a collector connected to an input terminal of the MIT transistor, and an emitter connected to the control terminal of the MIT transistor.

In still other embodiments, the transistor may include a PNP bipolar transistor having a base to which the pulse input signal is received, an emitter connected to an input terminal of the MIT transistor, and a collector connected to the control terminal of the MIT transistor.

In even other embodiments, the transistor may include a PNP bipolar transistor having a base to which the pulse input signal is received, an emitter connected to the control terminal of the MIT transistor, and a collector that is grounded.

In yet other embodiments, the transistor may include an NPN bipolar transistor having a base to which the pulse input signal is received, a collector connected to the control terminal of the MIT transistor, and an emitter that is grounded.

In further embodiments, the transistor may include an N type field effect transistor having a gate to which the pulse input signal is received, a drain connected to an input terminal of the MIT transistor, and a source connected to the control terminal of the MIT transistor.

In still further embodiments, the transistor may include an N type field effect transistor having a gate to which the pulse input signal is received, a drain connected to the control terminal of the MIT transistor, and a source that is grounded.

In even further embodiments, the transistor may include a P type field effect transistor having a gate to which the pulse input signal is received, a source connected to an input terminal of the MIT transistor, and a drain connected to the control terminal of the MIT transistor.

In yet further embodiments, the transistor may include a P type field effect transistor having a gate to which the pulse input signal is received, a source connected to the control terminal of the MIT transistor, and a drain that is grounded.

In much further embodiments, the current supplier may supply power induced at a secondary coil of a transformer to the control terminal of the MIT transistor.

In still much further embodiments, the MIT transistor may include, as a current device, a forward active mode bipolar transistor operating in a negative differential resistance (NDR) mode as an MIT phenomenon when a critical current is applied.

In even much further embodiments, the MIT transistor may include, as a current device, a reverse active mode bipolar transistor operating in an NDR mode as an MIT phenomenon when a critical current is applied.

In yet much further embodiments, the MIT transistor may operate in an NDR mode.

In still yet much further embodiments, the current supplier and the MIT transistor may be manufactured on a single identical substrate by monolithic method, or the current supplier and the MIT transistor are manufactured in a same package.

In other embodiments of the present invention, MIT transistor systems includes: an MIT transistor having an input terminal, an output terminal, and a control terminal, and allowing MIT to occur therein; and a current supplier connected between the input and control terminals of the MIT transistor, and, when the input and output terminals are connected between a power supply voltage and a ground voltage, receiving an input signal and allowing the MIT phenomenon to occur between the control and output terminals.

In still other embodiments of the present invention, operation methods of an MIT transistor system, include: connecting, to input and output loads, an MIT transistor having an input terminal, an output terminal, and a control terminal, and allowing MIT to occur therein; receiving an input signal; and generating a critical current for allowing an MIT phenomenon to occur between the control and output terminals by using the input signal.

In some embodiments, the critical current may be that the input signal is amplified in a pulse type.

In even other embodiments of the present invention, MIT transistor systems includes: a first MIT transistor having an input terminal, an output terminal and a control terminal, and allowing MIT to occur; a second MIT transistor having an input terminal, an output terminal and a control terminal, and allowing MIT to occur; a transformer connected between the first and second MIT transistors; a pulse generator generating a signal of a pulse type; and an amplifier amplifying the signal and applying the amplified signal to the control terminal of the first MIT transistor.

In some embodiments, the transformer may be connected between the input terminal of the first MIT transistor and the control terminal of the second MIT transistor, or between the output terminal of the first MIT transistor and the control terminal of the second MIT.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
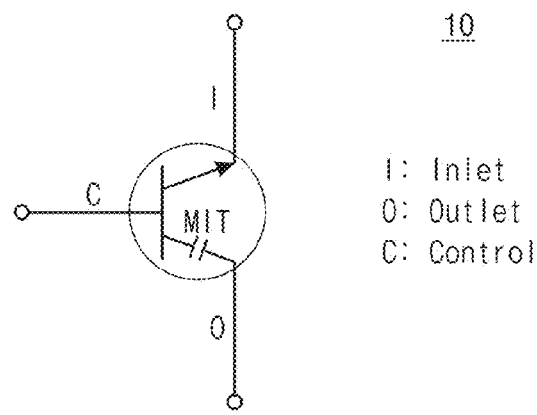
FIG. 1 illustrates definitions of symbols and terminals of an MIT transistor.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the present disclosure, if certain devices or lines are described as being connected to a target device block, they are not only directly connected to the target device block, but also connected to the target device block by means of any other device.

Also, the same or similar reference numerals provided in each drawing denote the same or similar components. In some drawings, connection relations between devices and lines are merely shown for efficient description of the technical spirit, and therefore other devices or circuit blocks may be further provided.

Exemplary embodiments set forth herein may include complementary embodiments thereof, and it will be noted that a general operation of a metal-insulator transition (MIT) transistor may be omitted so as not to obscure the essential point of the inventive concept.

Hereinafter, it will be described about an exemplary embodiment of the present invention in conjunction with the accompanying drawings.

FIG. 1 illustrates definitions of symbols and terminals of an MIT transistor.

FIG. 1 shows an MIT transistor 10. This kind of three terminal device is referred to as t-switch or MIT transistor. The MIT transistor is also referred to as MITR in abbreviations.

The MIT transistor 10 of FIG. 1 is, differently from a semiconductor transistor, includes three terminals of an inlet I, an outlet O, and a control C. Here, the inlet functions as an input terminal, the outlet functions as an output terminal, and the control functions as a control terminal.

When a current flows through the terminal C of the MIT transistor 10, an MIT phenomenon occurs between the control terminal (terminal C) and the output terminal and then a large current flows from the input terminal (terminal I) to the output terminal (terminal O) due to the MIT phenomenon.

The MIT transistor 10 in which a discontinuous jump phenomenon appears on being turned-on is a device switching between an insulator and a metal by using the insulator (or semiconductor)-metal transition (MIT) phenomenon.

When the MIT phenomenon occurs between the control and output terminals of the MIT transistor 10, a concentration of holes doped to a control layer is required to be about $n_c=(0.25/a_0)^3$. Here, $a_0$ means the Bohr radius of a hydrogen atom. Typically, $n_c \approx 1 \times 10^{18}$ cm$^{-3}$. A current including holes of about $n_c$ should be flowed. This current is called as a critical current $I_{Critical\ current}$, which is a maximum current flowing through semiconductor. Therefore, it is necessary to supply the critical current for driving the MIT transistor 10.

Figure 2:
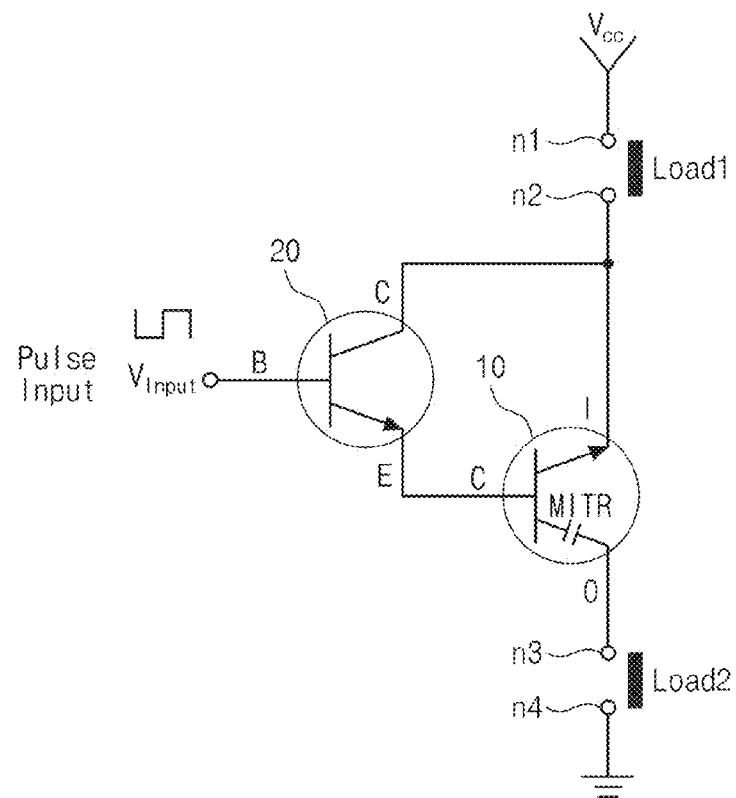
FIG. 2 is a circuit diagram of an MIT transistor system according to an embodiment of the present invention.

In embodiments of the present invention, a current supplier supplying the critical current is realized as shown in FIGS. 2, 3, 7, 9, 11, and 13. In FIG. 2, an NPN bipolar transistor is realized as the current supplier, and in FIG. 3, N-type field effect transistor is realized as the current supplier.

FIG. 2 is a circuit diagram of the MIT transistor system according to an embodiment of the present invention.

Referring to FIG. 2, the MIT transistor system includes an MIT transistor 10, and a current supplier 20 supplying a critical current in order for an MIT phenomenon to occur between the control terminal and the output terminal of the MIT transistor 10.

Here, the current supplier 20 is realized with a bipolar transistor receiving a pulse input and generating the critical current.

That is, the bipolar transistor receives the pulse input with a base B. A collector C is connected to an input terminal I of the MIT transistor 10 and an emitter E is connected to the control terminal C of the MIT transistor 10.

The input terminal I of the MIT transistor 10 is connected to a power supply voltage Vcc through a first load connected between nodes n1 and n2, and the output terminal O of the MIT transistor 10 is connected to a ground voltage Vss through a second load connected between nodes n3 and n4.

Figure 3:
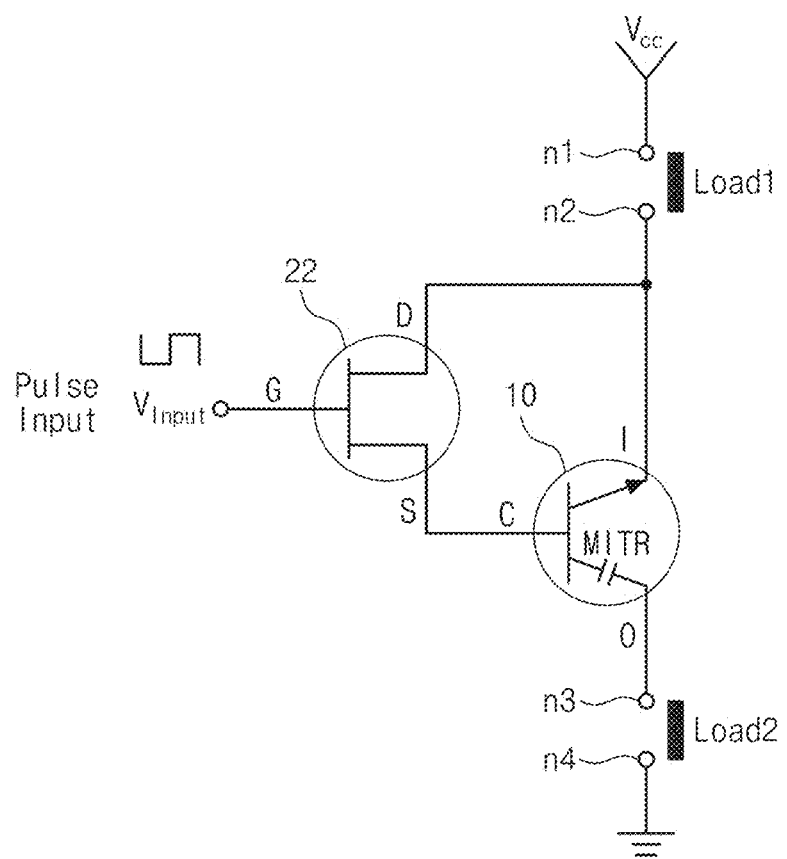
FIG. 3 is a circuit diagram of an MIT transistor system according to another embodiment of the present invention.

In FIG. 2, although a bipolar NPN transistor is used as a critical current supply device in order for the MIT to occur between the control terminal C and the output terminal O of the MIT transistor 10, a field effect transistor may also be used as shown in FIG. 3.

The current supplier 20 may also be realized by using an operational amplifier.

In the end, the MIT transistor 10 may be driven by a device for supplying a critical current or an arbitrary device.

In an embodiment of the present invention, a system includes two or more devices. For example, the system of FIG. 2 or FIG. 3 includes two or more devices (a critical current supply device and an MIT transistor), so it is called as a system.

Furthermore, the bipolar transistor or the field effect transistor, which is a current supply transistor, may be manufactured as a monolithic integrated circuit on one substrate with the MIT transistor. In addition, two transistors shown in FIG. 2 may be manufactured as one package.

In addition, the current supply transistor and the MIT transistor may be included in an integrated circuit, such as an existing microprocessor, memory, or a power device like an insulated-gate bipolar transistor (IGBT).

FIG. 3 is a circuit diagram of an MIT transistor system according to another embodiment of the present invention.

In FIG. 3, a current supplier is realized with a metal-oxide-semiconductor field-effect transistor (MOSFET), which is different from FIG. 2. That is, a field effect transistor 22 is used as a device for supplying the critical current to the control terminal C of the MIT transistor 10 in order for the MIT phenomenon to occur between the control terminal C and the output terminal O of the MIT transistor 10.

Figure 4:
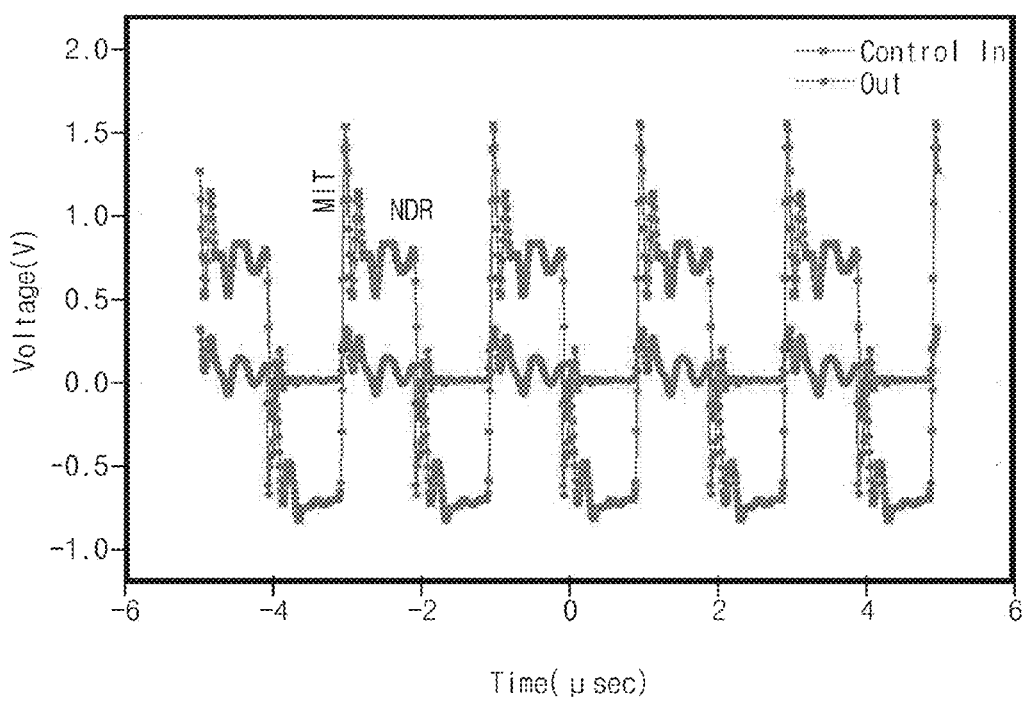
FIG. 4 is a characteristic waveform diagram of two-terminal effect according to FIG. 2.

FIG. 4 is a characteristic waveform diagram of two-terminal effect according to FIG. 2.

Measurement conditions in FIG. 4 are $V_{control}$=2V, $V_{inlet}$=0V, Load 1=0, and Load 2=1 W. In the drawing, a horizontal axis denotes a time, and a vertical axis denotes a voltage output from a system.

Figure 5:
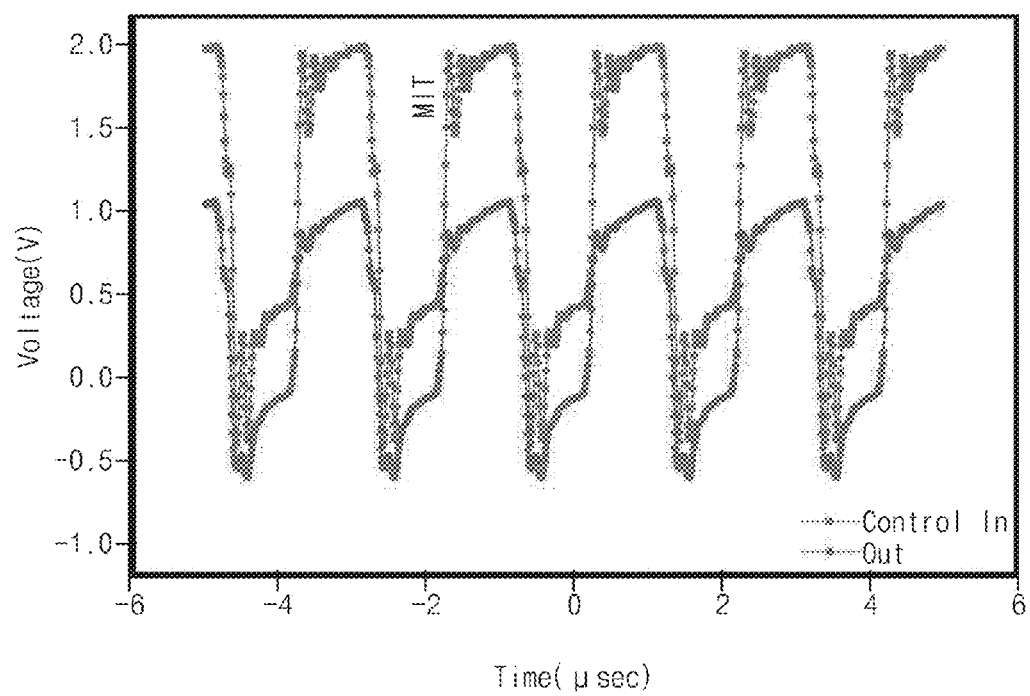
FIG. 5 is a characteristic waveform diagram of three-terminal effect according to FIG. 2.

FIG. 5 is a characteristic waveform diagram of three-terminal effect according to FIG. 2.

Similarly, in the drawing, a horizontal axis denotes a time and a vertical axis denotes a voltage output from a system.

When the NPN transistor 20 of FIG. 2 is used as a current supplier for supplying a critical current, an input pulse of 500 kHz is provided to a base of the NPN transistor 20. Measurement conditions are identical to those of FIG. 4 except the inlet voltage $V_{inlet}$=7V.

Since the measurement result waveform of FIG. 5 shows characteristics of a three-terminal MIT transistor, it can be known that the NP transistor 20 sufficiently plays a role as a current supplier.

For detailed description with reference to FIG. 2 again, in order for the MIT phenomenon to occur between the control terminal and the output terminal of the MIT transistor, a critical current by holes of Mott criteria $n_c$=1×10$^{18}$ cm$^{-3}$ is required to flow from the control terminal to the output terminal. In order to achieve this, the NPN transistor 20 (2N3904) for critical current supply is connected as shown in FIG. 2, and a pulse signal of a small current is applied to a base terminal of the current supply transistor 20. Then, due to amplification by the current supply transistor 20, a larger current than the applied one flows from a collector C to an emitter E and is provided to the control terminal of the MIT transistor 10. Accordingly, the MIT occurs between the control terminal and the output terminal of the MIT transistor 10 and allows a large current to flow from the input terminal to the output terminal Here, the MIT transistor 10 is realized by connecting a transistor such as 2N3904 in a reverse active mode. The reason why the transistor such as 2N3904 is realized as the MIT transistor is because an operation according to the reverse active mode connection of 2N3904 is identical to that of the MIT transistor 10.

The transistors adopted in FIG. 2 are two 2N3904 transistors. One of them is connected in a forward active mode for the critical current supply, and the other one is connected in a reverse active mode for functioning as the MIT transistor.

In the system of FIG. 2, at first, in order to observe the MIT phenomenon in the MIT transistor 10, measurement was performed under conditions 500 KHz, $V_{control}$=2V, $V_{inlet}$=0V, Load 1=0, Load 2=1 W. Here, since a voltage across the input terminal is 0, the system actually operated as a two-terminal MIT device. FIG. 4 shows this. A top portion of the waveform of FIG. 4 is a signal measured at the control terminal. In this case, the magnitude of a signal peak is about 1.5V. A bottom portion of the waveform is a signal measured at an output terminal. In this case, the magnitude of a signal peak is 0.3 V. The signal measured at the output terminal corresponds to a current, since a resistance of the second load is 1 ohm.

The MIT phenomenon occurs at a peak portion at which the control signal sharply rises and then a voltage instantly drops, which is due to occurrence of a negative differential resistance (NDR) phenomenon that a current is limited right after the MIT occurs and the resistance is reduced. The peak and NDR phenomenon are evidences showing occurrence of the MIT. When the peak occurs, a bottom portion signal also shows a small peak in FIG. 4. The current at this time is the MIT current of about 0.3 A.

Under the above-described conditions, when the inlet voltage of $V_{inlet}$=7V is applied, the system of FIG. 2 functions as a normal three-terminal device. That is, it operates as a normal MIT transistor. The top portion signal in FIG. 5 increases to 2V and a lower portion signal increases to 1V. The bottom portion signal of 1V corresponds to a current of 1 A due to 1 ohm resistance of Load 2. Therefore, a larger current can be controlled with a pulse signal at the control terminal. Accordingly, as shown in FIG. 5, the experiment of FIG. 2 shows that a critical current supply device operates well and the MIT transistor normally operates.

Figure 6:
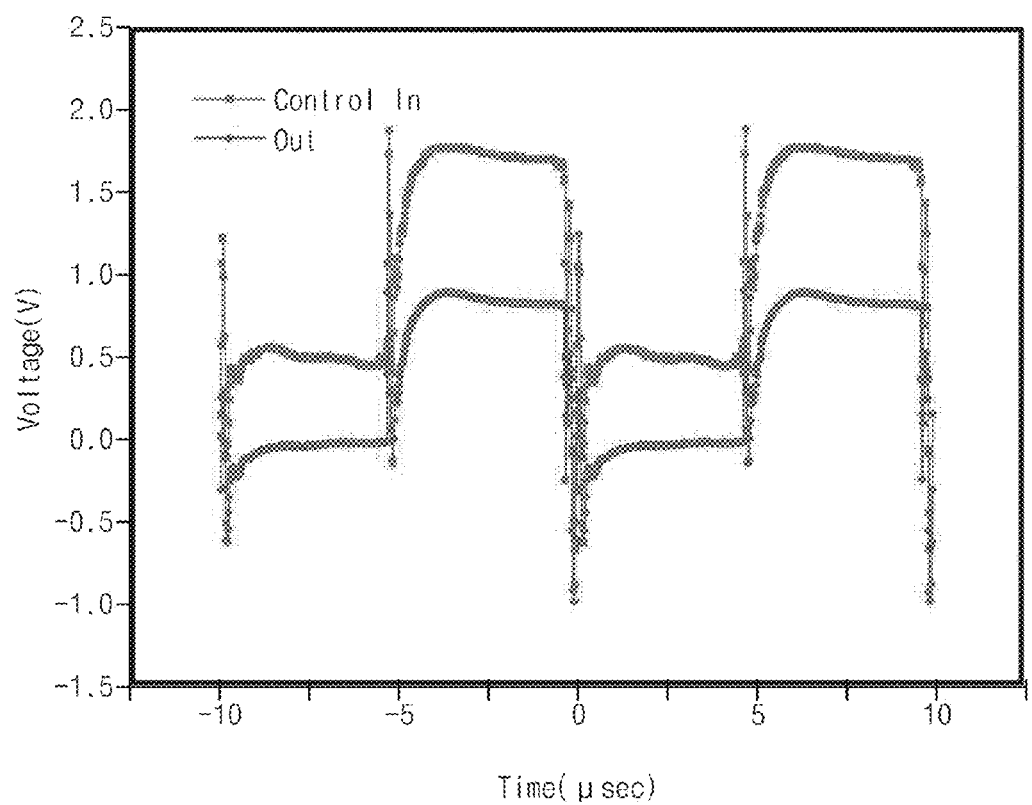
FIG. 6 is a characteristic waveform diagram according to FIG. 3.

FIG. 6 is a characteristic waveform diagram according to FIG. 3.

In the drawing, a horizontal axis denotes a time, and a vertical axis denotes a voltage output from the system of FIG. 3.

The measurement result of FIG. 6 is obtained by a case where the field effect transistor 22 such as IRF640 is used as a current supplier for supplying a critical current and a transistor such as 2N3904 is used as the MIT transistor 10.

The measurement conditions of FIG. 6 are that a pulse signal of 100 kHz and 2V is applied to the gate of the IFR640 and $V_{inlet}$=7V. The measurement result shows that the supply transistor 22 normally operates and the MIT transistor 10 normally operates. When the field effect transistor is used as a current supply transistor, current consumption is less than that of a bipolar transistor. Even in FIG. 3, the MIT transistor 10 is realized by connecting 2N3904 transistor in a reverse active mode.

Figure 7:
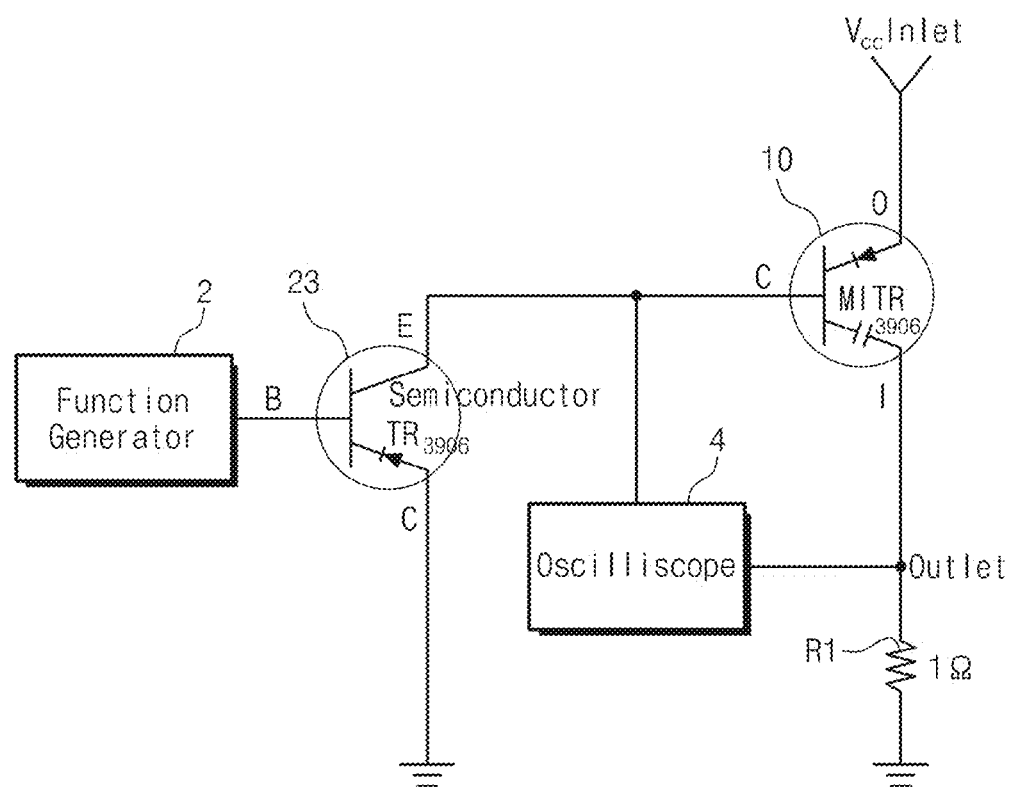
FIG. 7 is a circuit diagram of an MIT transistor system according to another embodiment of the present invention.

FIG. 7 is a circuit diagram of an MIT transistor system according to another embodiment of the present invention.

In FIG. 7, the MIT transistor 10 is realized by connecting PNP 2N3906 transistor in a reverse active mode, and the current supplier 23 is realized by connecting PNP 2N3906 transistor in a forward active mode.

That is, 2N3906, which is a critical current supply transistor, is connected in the forward active mode as a general transistor. In this case, the emitter of the critical current supply transistor 23 is connected to the control terminal of the MIT transistor 10. In FIG. 7, a reference numeral 2 denotes a function generator generating an input pulse of 100 kHz, and a reference numeral 4 denotes an oscilloscope or a monitor measuring a signal applied to the control terminal of the MIT transistor 10.

Figure 8:
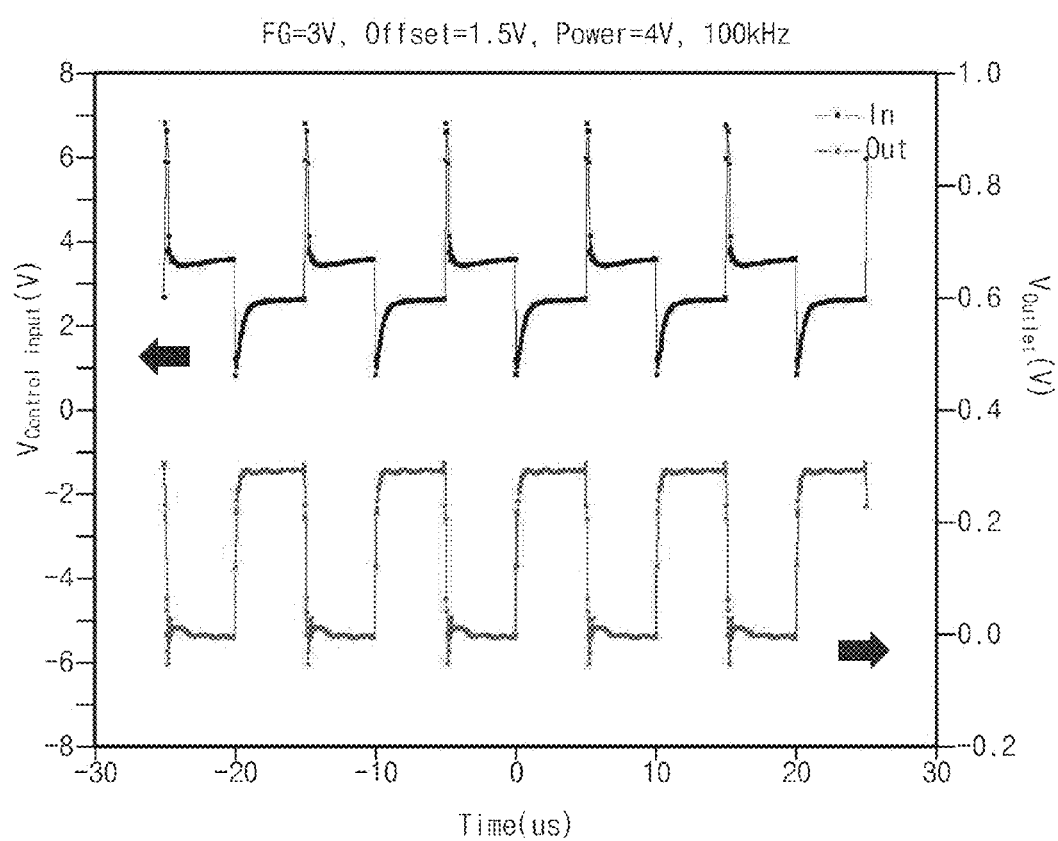
FIG. 8 is a characteristic waveform diagram according to FIG. 7.

FIG. 8 is a characteristic waveform diagram according to FIG. 7.

FIG. 8 shows experiment data measured according to system realization of FIG. 7. In the drawing, a horizontal axis denotes a time and a vertical axis denotes a voltage output from the system.

An input signal from the function generator is a signal of 100 kHz, 3V, and an offset of 1.5 V, and finally 6V. An input power supply voltage at the input terminal is 4V. $V_{control\ input}$ (V) of the left axis is a signal measured at the control terminal of the MIT transistor 10. The peaks in the signal mean NDR phenomena. This NDR occurs when the MIT occurs and is an evidence of the MIT. A right axis indicates a signal measured at the output terminal. In this case, the current is about 0.3 A.

As confirmed in FIG. 8, it can be seen that the system of FIG. 7 operates as a circuit generating an MIT phenomenon.

Figure 9:
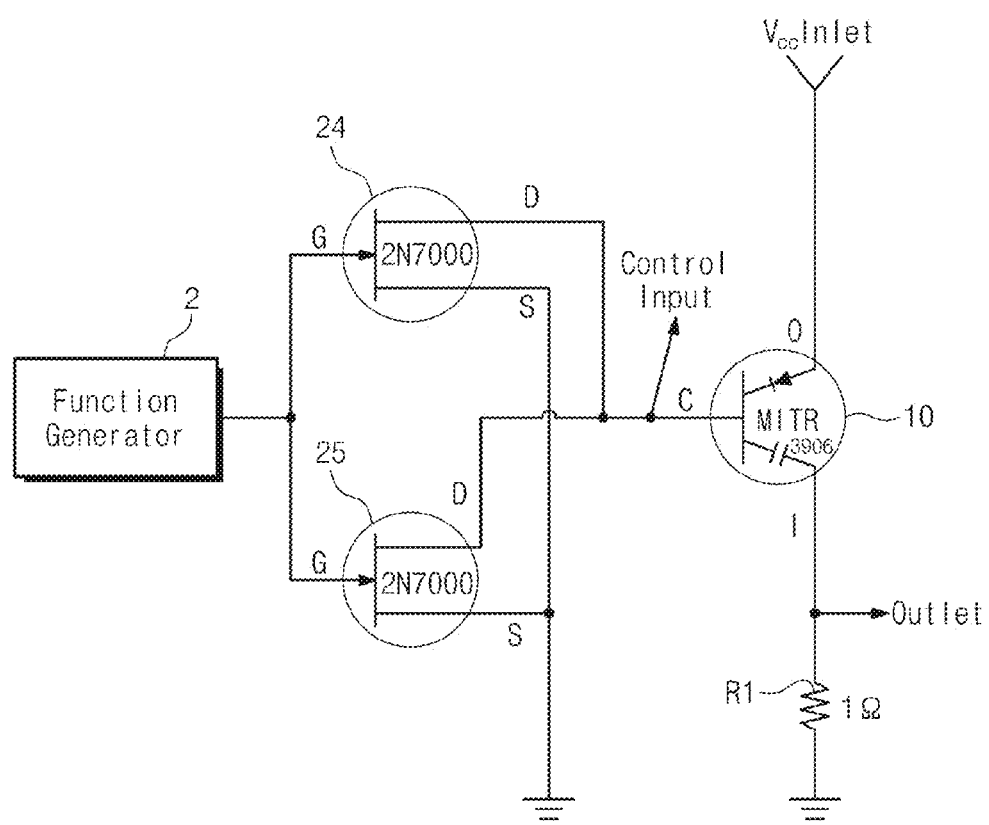
FIG. 9 is a circuit diagram of an MIT transistor system according to a first modified embodiment of FIG. 3.

FIG. 9 is a circuit diagram of an MIT transistor system according a first modified embodiment of FIG. 3.

Referring to FIG. 9, PNP 2N3906 transistor connected in a reverse active mode is used as the MIT transistor 10. As a current supplier for critical current supply, two N-type field effect transistors are used. The system structure of FIG. 9 is similar to that of FIG. 3 except use of PNP 2N3906 as the MIT transistor 10.

Figure 10:
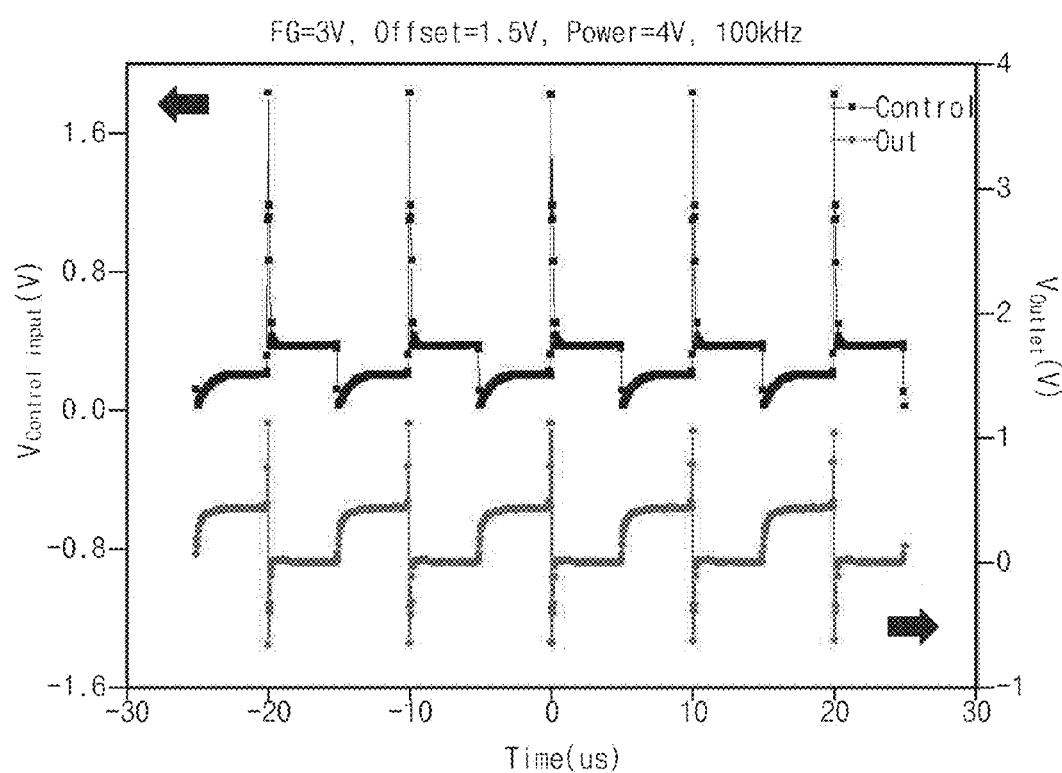
FIG. 10 is a characteristic waveform diagram according to FIG. 9.

FIG. 10 is a characteristic waveform diagram according to FIG. 9.

In the drawing, a horizontal axis denotes a time and a vertical axis denotes a voltage output from the system.

In FIG. 10, the left side axis shows peaks of an NDR signal as an input voltage at the control terminal. The right side axis is an output signal measured at the output terminal and also shows peaks of the NDR signal. A peak of 1V denotes a current corresponding to 1 A for 1 ohm resistance.

Figure 11:
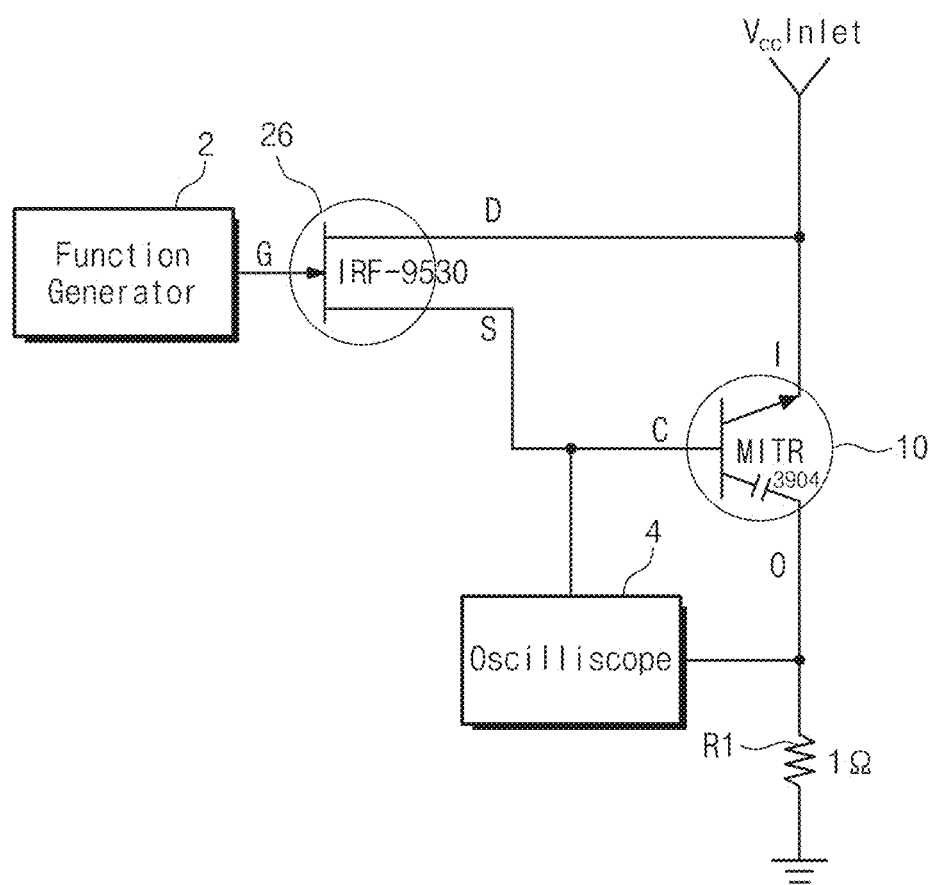
FIG. 11 is a circuit diagram of an MIT transistor system according to a second modified embodiment of FIG. 3.

FIG. 11 is a circuit diagram of an MIT transistor system according to a second modified embodiment of FIG. 3.

FIG. 11 has similar system configuration to that of FIG. 3 except that the critical current supply transistor 26 is formed of P-type field effect transistor as the current supplier.

Figure 12:
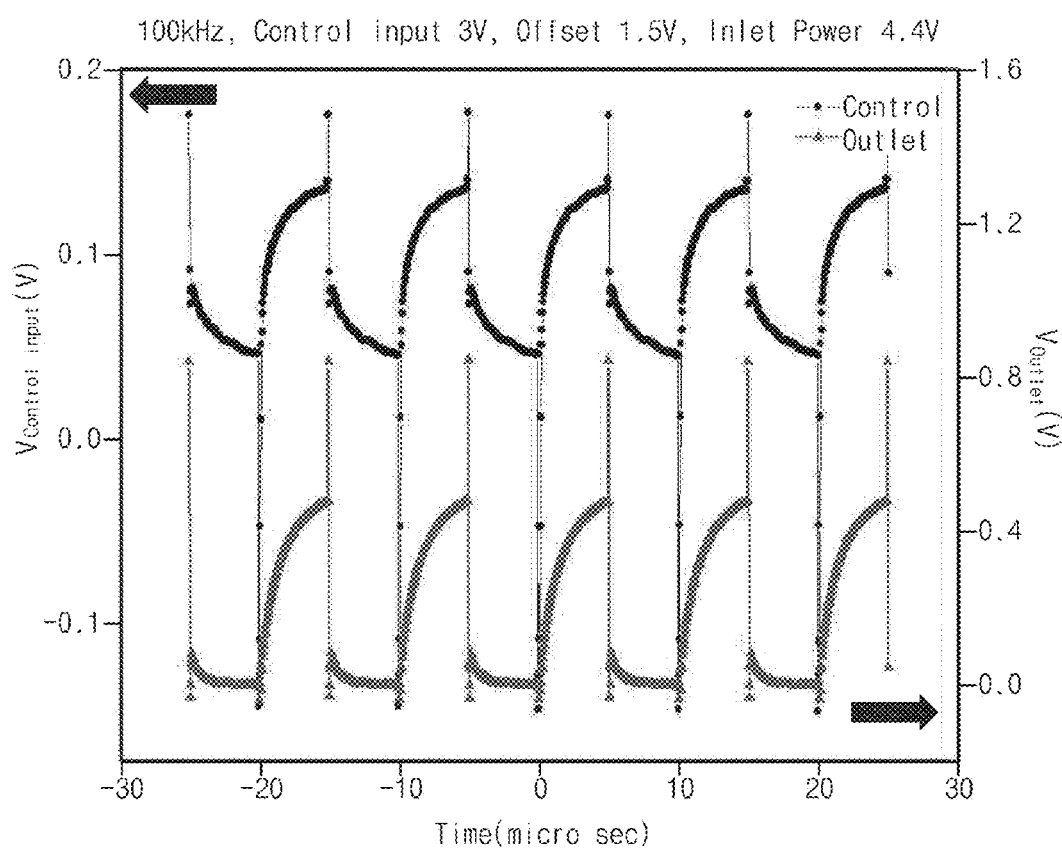
FIG. 12 is a characteristic waveform diagram according to FIG. 11.

FIG. 12 is a characteristic waveform diagram according to FIG. 11.

In the drawing, a horizontal axis denotes a time and a vertical axis denotes a voltage output from the system. Even when a P-type field effect transistor is used, NDR peaks can be seen in FIG. 12 like other data. In this case, since about 0.8 V is obtained from an output at the output terminal, a current of 0.8 A flows for 1 ohm resistance.

Figure 13:
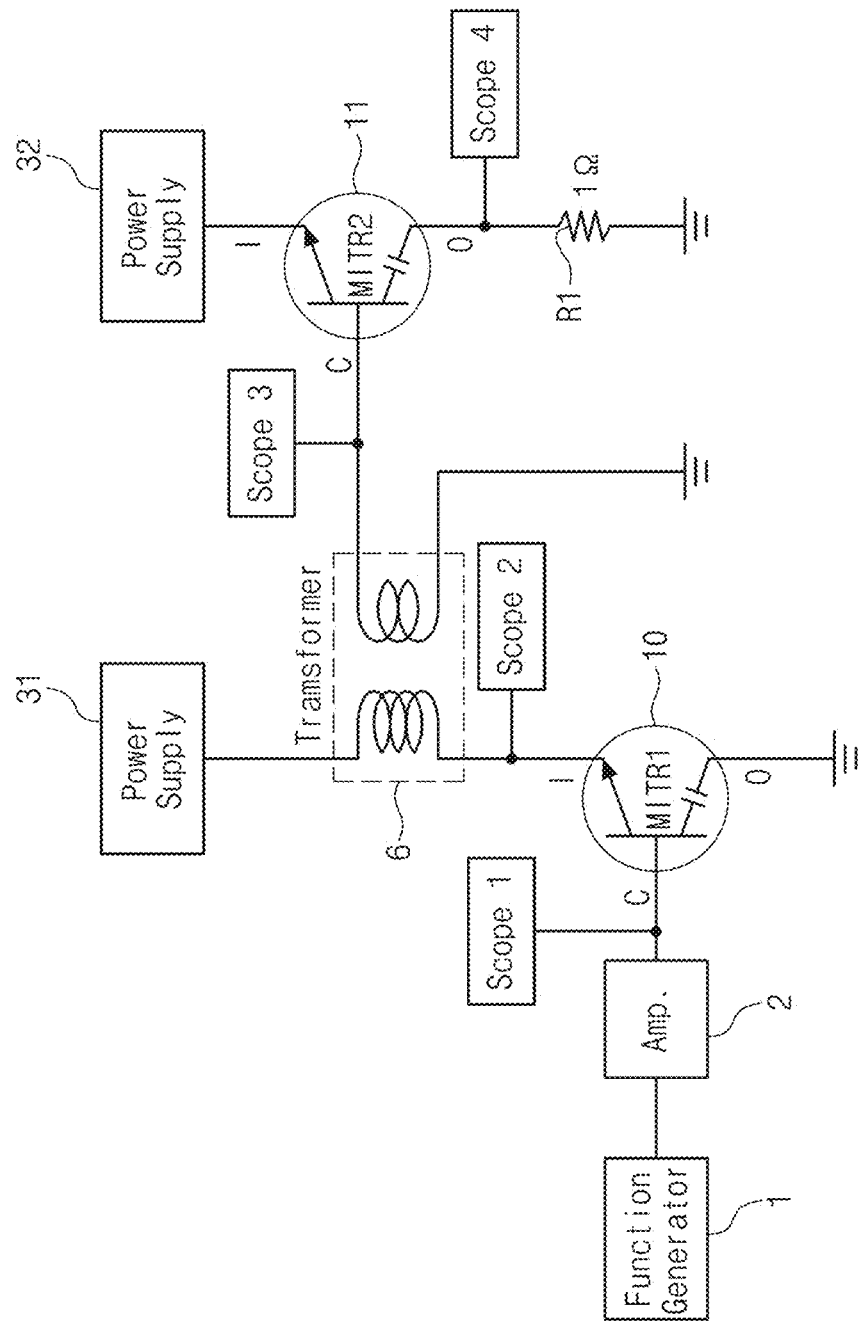
FIG. 13 is a circuit diagram of an MIT transistor system according to another embodiment of the present invention.

FIG. 13 is a circuit diagram of an MIT transistor system according to another embodiment of the present invention.

FIG. 13 shows a system employing a switching power supply as a current supplier. The switching power supply includes an MIT transistor (MITR1) 10 and a switching transformer 6.

The MIT transistor (MITR1) 10 functions as switching transistor.

An ac current generated at a secondary coil of the transformer 6 is applied to the control terminal of the MIT transistor 11.

Figure 14:
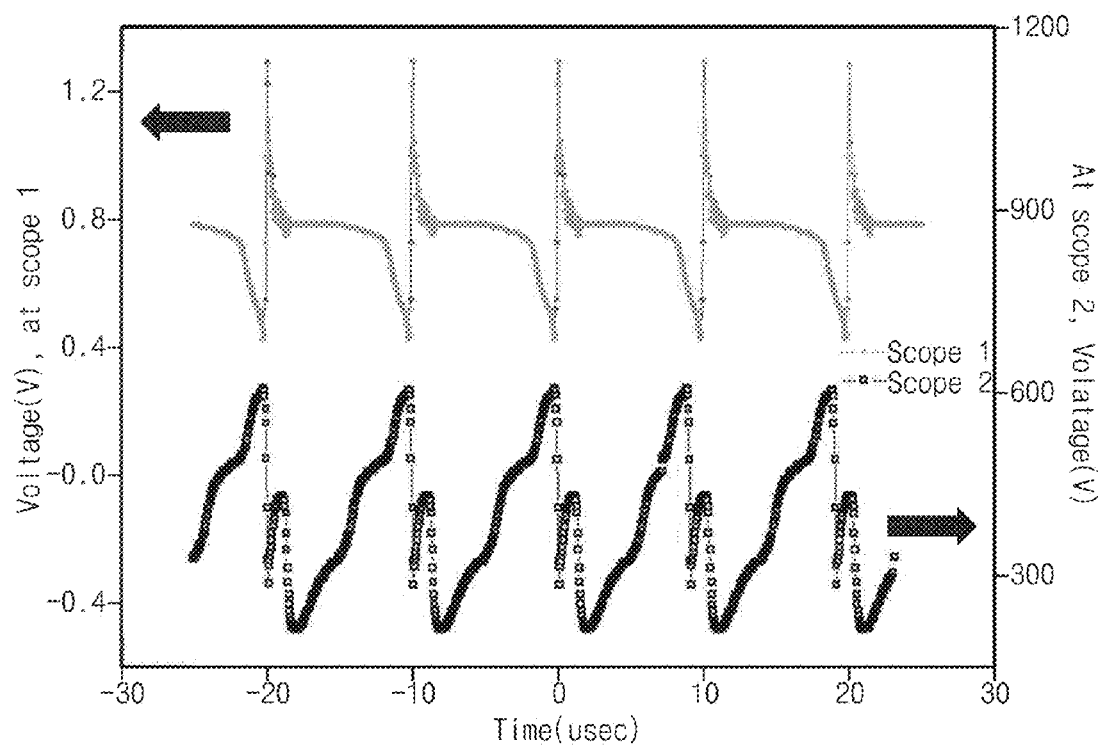
FIG. 14 is a characteristic waveform appeared on first and second oscilloscopes of FIG. 13.

The switching speed of the MIT transistor (MITR1) 10 is 100 kHz. The transformer 6 for high frequency operation is used which has a capacity that 1 A can flow at 10V and 100 kHz. First, the switching operation of the MIT transistor (MITR1) 10 is realized by generating a square wave of 100 kHz in a function generator 1 and supplying a critical current amplified by an amplifier 2 to the control terminal. In this case, the waveform is measured by oscilloscopes 1 and 2. The measurement result is shown in FIG. 14. Peaks measured in the oscilloscope 1 are experimental evidences indicating that the MIT phenomenon (NDR) occurs. The NDR is one phenomenon of MIT and the abbreviation for negative differential resistance. The amplifier 2 may be realized with non-inverting operational amplifier and have an amplification factor of about 100 times.

The current induced to the secondary coil of the transformer 6 corresponds to a magnitude of the critical current for the MIT transistor. The induced current is input to the control terminal of MITR2 11. The experimental result according to an operation of the MITR2 11 is measured by oscilloscopes 3 and 4 as shown in FIG. 15.

Figure 15:
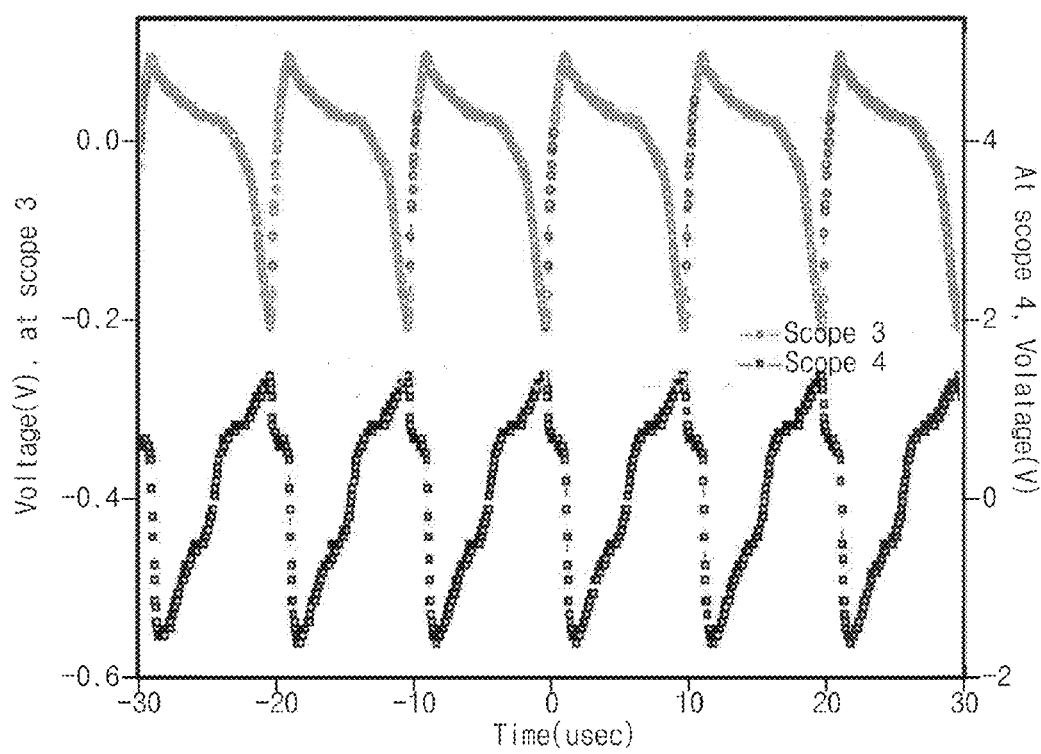
FIG. 15 is a characteristic waveform appeared on third and fourth oscilloscopes of FIG. 13.

As shown in the oscilloscopes 3 and 4, the peaks (NDR phenomenon) mean occurrence of the MIT (see FIG. 15). The current flowing thought the output terminal of the MITR2 11 is about 300 mA. In this case, the resistance value of a resistor R1 is 1 ohm, and data on the oscilloscope 4 is that appears at a connection point of the output terminal and the resistor R1. As known through FIGS. 14 and 15, an MIT critical current may be provided from the power supply of FIG. 13.

FIG. 14 is a characteristic waveform diagram appeared on the oscilloscopes 1 and 2 of FIG. 13. The output of the amplifier 2 appears on the oscilloscope 1 (top portion waveform of FIG. 14), and a signal between the transformer 6 and the input terminal of the MIT transistor (MITR1) 10 appears on the oscilloscope 2 (bottom portion of FIG. 14). As shown on the oscilloscope 1, when the current supplier operates at 100 kHz, peaks shown at the input terminal of the MIT transistor 10 show evidences representing that the MIT phenomenon occurs in the MITRI 10.

Furthermore, FIG. 15 is a characteristic waveform diagram appearing on the oscilloscopes 3 and 4 of FIG. 13. As shown in a top portion waveform of FIG. 15, a current induced at the secondary coil of the transformer 6 is shown through the oscilloscope 3. The induced current is a critical current and applied to the control terminal of the MIT transistor 11 to allow the MIT phenomenon to occur in the MIT transistor 11. As shown in a bottom portion waveform of FIG. 15, a current obtained at the output terminal of the MIT transistor 11 is observed through the oscilloscope 4. Peaks of a waveform measured through FIG. 15 show evidences representing that the MIT phenomenon occurs in the MIT transistor 11.

In the drawings of FIGS. 14 and 15, a horizontal axis denotes a time and a vertical axis denotes a voltage output from the system.

Figure 16:
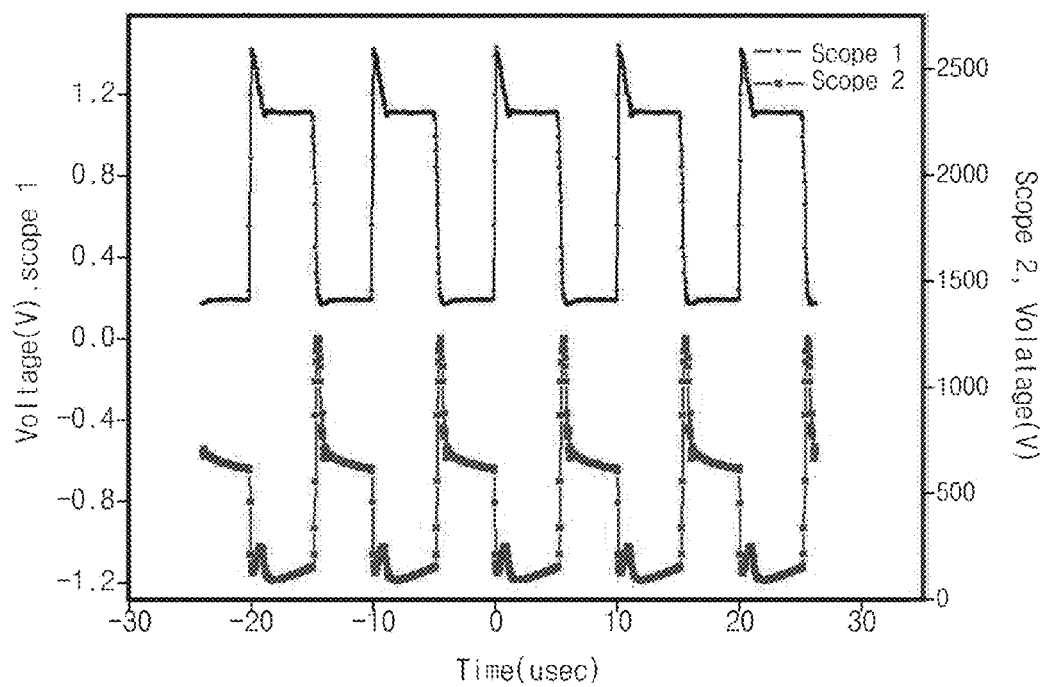
FIG. 16 is a characteristic waveform diagram appeared in first and second oscilloscopes when an MITR1 and 2 operate in a forward mode in FIG. 13.

FIG. 16 is a characteristic waveform diagram appearing on the oscilloscopes 1 and 2 when the MITR1 and MITR2 operate in the forward active mode in FIG. 13, and through this, NDR peaks are observed.

Figure 17:
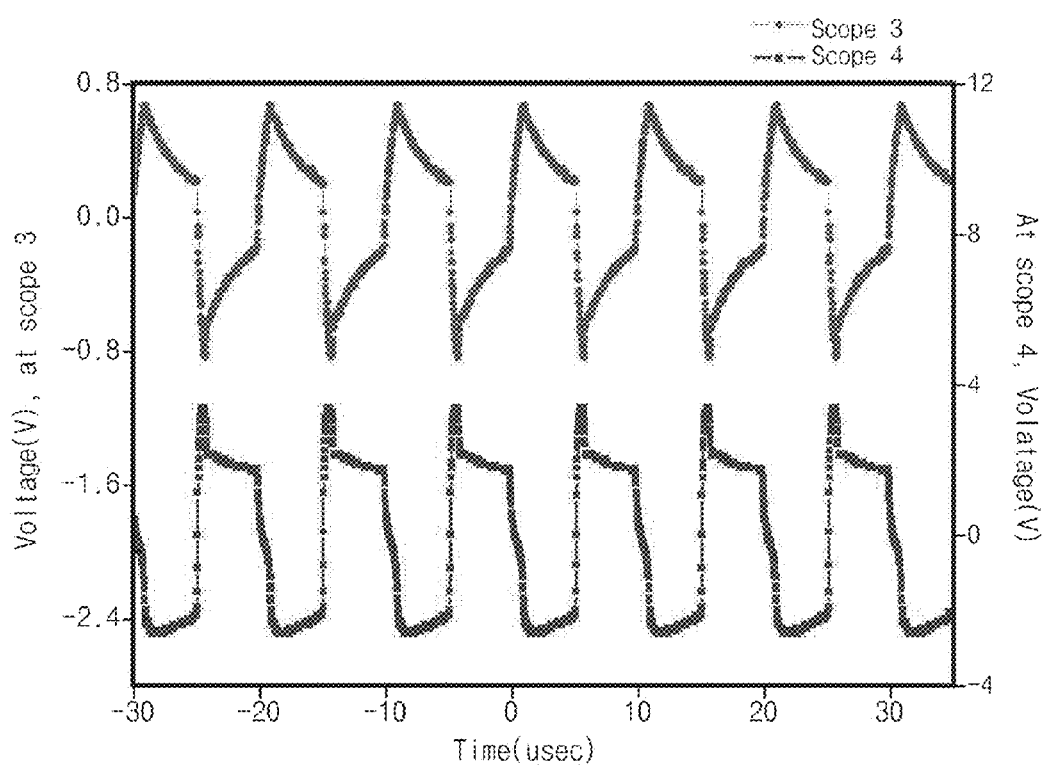
FIG. 17 is a characteristic waveform diagram appeared in third and fourth oscilloscopes when an MITR1 and 2 operate in a forward mode in FIG. 13.

FIG. 17 is a characteristic waveform diagram appearing on the oscilloscopes 3 and 4 when the MITR1 and MITR2 operate in the forward active mode in FIG. 13, and through this, NDR peaks are observed. Results of FIGS. 16 and 17 show evidences that the MIT transistor also operates in the forward active mode of a bipolar transistor.

Similarly, in the drawings of FIGS. 16 and 17, a horizontal axis denotes a time and a vertical axis denotes a voltage output from the system.

Figure 18:
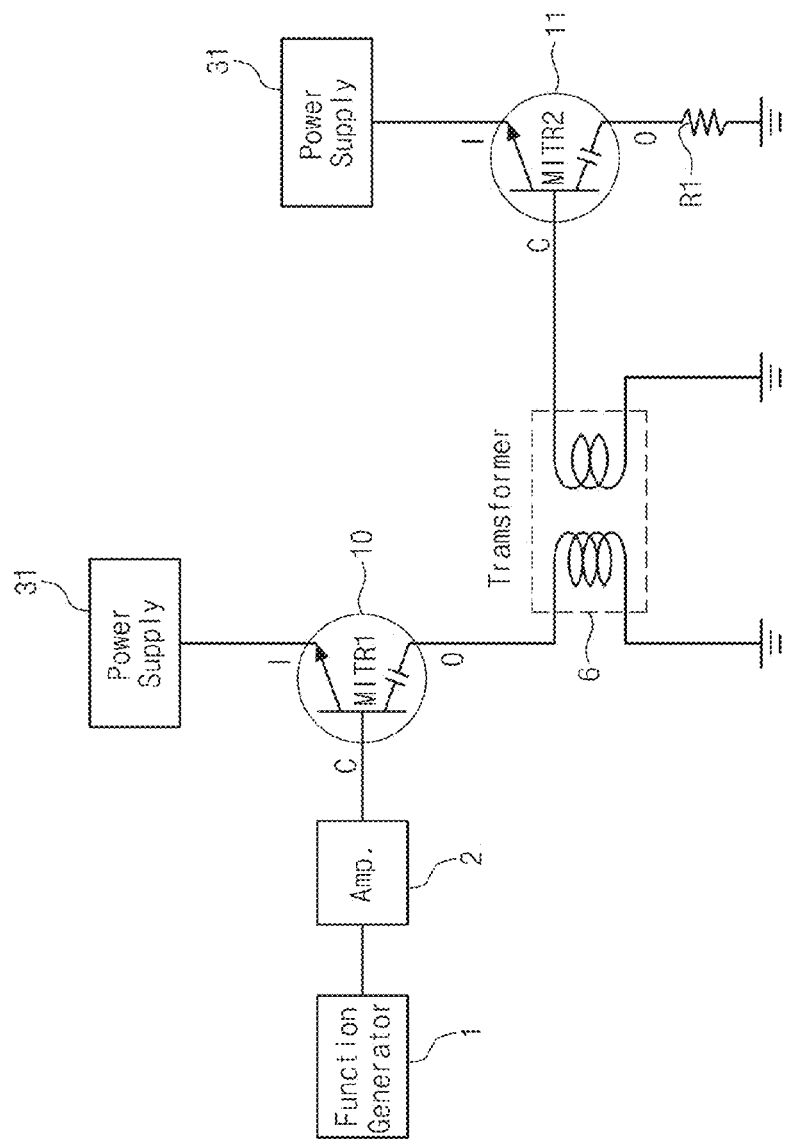
FIG. 18 is a circuit diagram of an MIT transistor system according to a modified embodiment of FIG. 13.

FIG. 18 is a modified embodiment of FIG. 13, and shows a structure that the output terminal O of the MITR1 10 is connected to a primary coil of the transformer 6. This may be more effective than the case of FIG. 13, because a current flowing into the control terminal C of the MITR1 10 in FIG. 13 is used.

As described above, according to an embodiment of the present invention, since a current supplier capable of supplying a critical current necessary for allowing an MIT phenomenon to occur in an MIT transistor is simply and efficiently provided, a smooth operation of the MIT transistor is possible.

In the specification, a current supplier is described as a transistor or a type into which a transistor and a transformer are combined, but detailed realization of the current supplier may be differed by modifying or adjusting a circuit configuration in the drawings without departing from the technical idea of the present invention.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A metal-insulator transition (MIT) transistor system, comprising:
   an MIT transistor having an input terminal, an output terminal, and a control terminal; and
   a current supplier connected between the input and control terminals of the MIT transistor, the current supplier being configured to, responding to a power supply voltage and a ground voltage respectively applied to the input and output terminals of the MIT transistor, receive an input signal and supply a critical current to the MIT transistor, to thereby cause an MIT phenomenon to occur between the control and output terminals of the MIT transistor, the MIT transistor being a current device operating in a negative differential resistance (NDR) mode when the MIT phenomenon occurs.

2. The MIT transistor system of claim 1, wherein the current supplier comprises a transistor receiving a pulse input signal to generate the critical current.

3. The MIT transistor system of claim 2, wherein the transistor comprises
   an NPN bipolar transistor having a base from which the pulse input signal is received,
   a collector connected to the input terminal of the MIT transistor, and
   an emitter connected to the control terminal of the MIT transistor.

4. The MIT transistor system of claim 2, wherein the transistor comprises
   a PNP bipolar transistor having a base from which the pulse input signal is received,
   an emitter connected to the input terminal of the MIT transistor, and
   a collector connected to the control terminal of the MIT transistor.

5. The MIT transistor system of claim 2, wherein the transistor comprises a PNP bipolar transistor having a base to which the pulse input signal is received, an emitter connected to the control terminal of the MIT transistor, and a collector that is grounded.

6. The MIT transistor system of claim 2, wherein the transistor comprises an NPN bipolar transistor having a base to which the pulse input signal is received, a collector connected to the control terminal of the MIT transistor, and an emitter that is grounded.

7. The MIT transistor system of claim 2, wherein the transistor comprises an N type field effect transistor having a gate to which the pulse input signal is received, a drain connected to an input terminal of the MIT transistor, and a source connected to the control terminal of the MIT transistor.

8. The MIT transistor system of claim 2, wherein the transistor comprises an N type field effect transistor having a gate to which the pulse input signal is received, a drain connected to the control terminal of the MIT transistor, and a source that is grounded.

9. The MIT transistor system of claim 2, wherein the transistor comprises a P type field effect transistor having a gate through which the pulse input signal is received, a source connected to an input terminal of the MIT transistor, and a drain connected to the control terminal of the MIT transistor.

10. The MIT transistor system of claim 2, wherein the transistor comprises a P type field effect transistor having a gate to which the pulse input signal is received, a source connected to the control terminal of the MIT transistor, and a drain that is grounded.

11. The MIT transistor system of claim 1, wherein the current supplier supplies power induced at a secondary coil of a transformer to the control terminal of the MIT transistor.

12. The MIT transistor system of claim 1, wherein the MIT transistor comprises, as a current device, a forward active mode bipolar transistor operating in a negative differential resistance (NDR) mode as an MIT phenomenon when a critical current is applied.

13. The MIT transistor system of claim 1, wherein the MIT transistor comprises, as a current device, a reverse active mode bipolar transistor operating in an NDR mode as an MIT phenomenon when a critical current is applied.

14. The MIT transistor system of claim 1, wherein the MIT transistor operates in an NDR mode.

15. The MIT transistor system of claim 1, wherein the current supplier and the MIT transistor are manufactured on a single identical substrate by a monolithic method, or in a same package.

* * * * *